United States Patent [19]

Mohri et al.

[11] Patent Number: 4,863,814
[45] Date of Patent: Sep. 5, 1989

[54] ELECTRODE AND A BATTERY WITH THE SAME

[75] Inventors: Motoo Mohri, Nara; Hideaki Tanaka, Tenri; Tomonari Suzuki, Kashihara; Yoshimitsu Tajima, Nara; Yoshikazu Yoshimoto, Tenri; Shigeo Nakajima, Nara; Michiyo Kasahara, Kyoto, all of Japan

[73] Assignee: Sharp Kabushiki Kaisha, Osaka, Japan

[21] Appl. No.: 30,886

[22] Filed: Mar. 26, 1987

[30] Foreign Application Priority Data

Mar. 27, 1986 [JP] Japan ............... 61-70205
May 30, 1986 [JP] Japan ............... 61-126724
Jul. 2, 1986 [JP] Japan ............... 61-156966
Jul. 22, 1986 [JP] Japan ............... 61-173326
Oct. 31, 1986 [JP] Japan ............... 61-261569

[51] Int. Cl.$^4$ .................................... H01M 6/14
[52] U.S. Cl. ................................. 429/60; 429/218; 429/194; 423/445
[58] Field of Search ............... 423/445, 448; 429/194, 429/196, 218, 60, 209; 252/182.1

[56] References Cited

U.S. PATENT DOCUMENTS

| 4,013,759 | 3/1977 | Giet | 423/445 |
| 4,163,829 | 8/1979 | Kronenberg | 429/194 |
| 4,534,949 | 8/1985 | Glaser et al. | 423/445 |
| 4,548,881 | 10/1985 | Nalewajek et al. | 429/194 |
| 4,576,697 | 3/1986 | Palmer | 429/194 X |
| 4,617,243 | 10/1986 | Nogami et al. | 429/194 |

FOREIGN PATENT DOCUMENTS 60-226405 4/1984 Japan.
61-111907 11/1984 Japan.

Primary Examiner—Anthony Skapars
Attorney, Agent, or Firm—Irell & Manella

[57] ABSTRACT

An electrode comprising as the main component carbon materials that have a layer structure more disordered than graphite and have hexagonal net faces with a selective orientation. Using said electrode, a secondary battery with a nonaqueous electrolytic solution is manufactured, which comprises a positive electrode, a nonaqueous electrolytic solution, and a negative electrode that has carbon materials as the active substances that can form an electrochemically reversible compound with a light-weight metal element, wherein said positive electrode is made such that its capacity for being charged or discharged is greater than that of said negative electrode.

11 Claims, 9 Drawing Sheets

ELECTRODE AND A BATTERY WITH THE SAME

BACKGROUND OF THE INVENTION

1. Field of the invention

This invention relates to a battery. More particularly, it relates to an active substance for an electrode in which alkali metals such as lithium, potassium, etc., alkaline earth metals, rare earth metals, or transition metals are used as a dopant, or halogens, halogen compounds, or oxygen acids are used as a dopant. It also relates to a secondary battery with a nonaqueous electrolytic solution, which comprises a negative electrode made of carbon materials that can reversibly absorb or release light-weight metals such as lithium, potassium, etc.

2. Description of the prior art

Secondary batteries that use lithium or other such alkali metals have received more attention as the miniaturization and energy-saving changes in electronic machinery, etc., have proceeded, and these batteries are now at the stage in which they can be used in practice. As the negative electrode, light-weight metals such as lithium, potassium, or light-weight metal alloys such as an alloy of lithium and aluminium or Wood's metal as representative low-melting-point alloys are used; for the positive electrode on the other side, metal oxides such as vanadium pentaoxide, chromiun trioxide, etc., chalcogen compounds such as titanium disulfide, organic polymers, or the like are mainly used.

It has been tried to use carbon materials in the electrodes of batteries. For example, active carbon or active carbon fiber has been used as the electrode materials, but the lamination layer of the hexagonal net faces that are constituted by the carbon atoms is not completely regular, so it is not possible to dope the carbon with each ion, and only electric double layer can be formed at the interface between the carbon and the electrolyte. Therefore, when these substances are used as the materials for the negative electrode, it is difficult to bring about doping with positive ions, and it is not possible to obtain more than the electric capacity that corresponds to the amount of ions to be accumulated into the electric double layer. The structure with a regular arrangement of hexagonal net faces made of carbon atoms is called a graphite structure. It has a laminated structure in which the carbon layers with the hexagonal net faces have stacked regularly with each other. It is possible for the dopant to have access to the spaces between the layers, but the space is narrow, 3.354 Å, and moreover, the hexagonal net faces have accumulated in a very regular manner, so that only a small quantity of dopant will be involved in doping at temperatures near room temperature. There is also a carbon material with a structure that is intermediate between amorphous carbon (like the above-mentioned activated carbon), the layered structure of which is completely irregular, and graphite, the layered structure of which is completely regular. This intermediate structure is generally called a turbostaratic structure, and many carbon materials in this category are known.

SUMMARY OF THE INVENTION

The electrode of this invention, which overcomes the above-discussed and numerous other disadvantages and deficiencies of the prior art, comprises as the main component carbon materials that have a layer structure more disordered than graphite and have hexagonal net faces with a selective orientation.

In a preferred embodiment, the carbon materials are carbon deposits that are obtained by thermal decomposition of the gas phase of a hydrocarbon or a hydrocarbon compound, which is prepared by the addition of a specific group including at least one selected from oxygen, nitrogen, sulfur, and a halogen to a part of said hydrocarbon or by the substitution of said specific group for a part of said hydrocarbon.

In a preferred embodiment, the carbon materials are doped with alkali metals, alkaline earth metals, rare earth metals, or transition metals.

In a preferred embodiment, the carbon metals are doped with halogens, halogen compounds, or oxygen acids.

In a preferred embodiment, the carbon materials are deposited on a conductive substrate.

In a preferred embodiment, the carbon materials have the mean spacing of the hexagonal net faces ranging from 3.37 Å to 3.55 Å, and have the ratio of the peak strength at 1,360 cm$^{-1}$ to the peak strength at 1,580 cm$^{-1}$ of the argon laser Raman spectrum ranging from 0.4 to 1.0.

In a preferred embodiment, the conductive substrate with a porosity of 60% or more.

The battery of this invention comprises an electron-donating substance and an electron-attracting substance as the charge carrier, wherein the substrate of said charge carrier is the electrode mentioned above.

In a preferred embodiment, the electron-donating substance is an alkali metal, an alkaline earth metal, a rare earth metal, or a transition metal.

In a preferred embodiment, the electron-attracting substance is a halogen or a halogen compound.

In a preferred embodiment, the conductive substrate of said electrode is a flat board, a metal foam, a nonwoven metal cloth, or a woven metal cloth.

The secondary battery with a nonaqueous electrolytic solution of this invention comprises a positive electrode, a nonaqueous electrolytic solution, and a negative electrode that has carbon materials according to claim 1 as the active substances that can form an electrochemically reversible compound with a light-weight metal element, wherein said positive electrode is made such that its capacity for being charged or discharged is greater than that of said negative electrode.

In an evaluation of electrode materials in which alkali metals such as lithium, potassium, etc., were applied as dopants to a variety of carbon materials, the following results were obtained. Carbon materials with structures that were disordered than oriented graphite structures and that had selectively oriented structures gave the best characteristics as the electrode materials. Carbon materials that had these desirable characteristics gave results from the analysis by the use of various methods, the detailed data from which are described below.

Carbon materials with the space between the carbon flat layers, obtained by the X-ray diffraction method with the use of CuK$_{60}$ rays, of from 0.337 nm to 0.355 nm gave suitable characteristics for use as an electrode material. The diffraction peak obtained by this method was not as sharp as the peak obtained for graphite, but was quite wide. The method to obtain the size of the unit crystal from the full-width of half of the maximum for the diffraction peak was used, and the value of the unit crystal in the direction of the c-axis was found; it was in the range of 2.0 nm to 10.0 nm. The diffraction peak of the (110) plane, which reflects the size of the unit crystal in the directions of the a and b axes, was almost absent, and even when it did appear, it was extremely broad, so the size of the unit crystal in the direction of the a and b axes was extremely small. By use of the laser Raman spectrum, the extent of the progress of graphitization was studied. The Raman spectrum at 1580 cm$^{-1}$ that originates from the graphite structure and also the Raman spectrum at 1360 cm$^{-1}$ that originates from imperfections in the graphite structure were observed, and accordingly it was concluded that the carbon material used herein had an imperfect crystal structure compared to that of graphite. As graphitization progressed, the peak at 1360 cm$^{-1}$ became smaller, and the peak at 1580 cm$^{-1}$ that arose from the lattice fluctuation characteristic of graphite became larger. The carbon material of this invention had a ratio ranging from 0.4 to 1.0 for the peak strength at 1360 cm$^{-1}$ to the peak strength at 1580 cm$^{-1}$ by Raman spectroscopy, which means that imperfections remained in the graphite structure.

The diffraction pattern by reflective high-energy electron rays showed broad rings for the diffraction rays that corresponded to the reflectance of the (002), (004), and (006) planes of the graphite structure, which means that the unit crystal was extremely small. These diffraction rings were studied in more detail, and it was found that the rings were not completely uniform; they were arc-shaped or like a broad spot, which showed that the position of each unit crystal was not random, but that the (00l) plane of each unit crystal was oriented in a specific direction.

As the amount of carbon particles to be accumulated gradually increases, resulting in a carbon crystal layer with an increased thickness, the accumulated carbon particles are presumed to be oriented in a specific direction with regard to the unit crystals of the underlying carbon particles. Therefore, even if the carbon particles are strongly oriented at the time when accumulation begins, as the thickness of accumulation increases, a diffraction pattern of the (00l) plane of the carbon particles in the vicinity of the surface obtained by reflective high-energy electron rays has a broad ring shape at ±90°. These carbon particles with strong orientation at the start of accumulation are also in the category of having selective orientation.

As mentioned above, carbon materials in which the spaces between the carbon layers are greater than those in graphite, and the size of the carbon unit crystal of which is small, and in which the carbon particles have some orientation therebetween, have good characteristics as an electrode material. The carbon particles that meet the above-mentioned requirements cannot be obtained by sintering carbon powder and/or carbon fibers. This means that even if carbon particles have the same physical values as the carbon particles used for this invention with regard to the space between the carbon layers and the size of the unit crystal, if the orientation of each unit crystal of the carbon particles is irregular, a large discharge capacity is not obtained, which causes difficulties in repeated charging and discharging over long periods of time.

The electrodes used for batteries of this invention can be obtained by the manufacturing method described below. The starting materials are a hydrocarbon or a hydrocarbon compound that is prepared by the addition of a specific group including at least one selected from oxygen, nitrogen, sulfur, or a halogen to a part of said hydrocarbon or by the substitution of the said specific group for a part of said hydrocarbon, (examples of which are benzene, naphthalene, anthracene, hexamethylbenzene, 1,2-dibromoethylene, 2-butene, acetylene, biphenyl, diphenylacetylene, etc.), or other suitable carbon compounds. The starting material is gasified and supplied to the reaction system in which the carbon materials undergo thermal decomposition at a low temperature, and carbon particles are deposited on a substrate, resulting in an electrode.

As the substrate, a flat board, a highly porous substrate, an insulating substrate, a conductive substrate, and other varieties of substrates can be used, but a conductive substrate that is porous is preferred. As a structure that is highly porous, generally, a metal with a three-dimensional structure, nonwoven metal cloths, woven metal cloths, or a sintered body in a flat form with a porosity of 60% or more can be used. The concentration and the temperature at which the low-temperature thermal decomposition is carried out are slightly different depending on the organic material used as the starting materials, but generally, the concentration is several millimolar percent and the temperature is set at around 1000° C. As the method for gasification, the bubbling method in which hydrogen and/or argon are used as a carrier gas, evaporation, or sublimation can be employed. Moreover, when the carbon particles are deposited on the conductive substrate, metals such as lithium can be used for doping at the same time.

The chargeable and dischargeable battery with a nonaqueous electrolytic solution of this invention is composed of a negative electrode made of the above-mentioned carbon particles, a positive electrode, and a nonaqueous electrolytic solution.

As the nonaqueous electrolytic solution, there is a single or mixture solution prepared by dissolving as electrolytes salts with an alkali metal ion as a cation in dimethylsulfoxide, γ-butyrolactone, propylene-carbonate, sulfolane, tetrahydrofuran, 2-methyltetrahydrofuran, 1,2-dimethoxyethane, 1,3-dioxolane, and other organic solvents, can be used as a single solvent or as a mixed solvent. The above-mentioned salts are, for example, lithium perchlorate, lithium hexafluoroarsenate, lithium borofluoride, lithium trifluoromethanesulfonate, etc.

In the positive electrode, metal oxides and chalcogens can be used alone or in a mixture; the metal oxides are, for example, vanadium oxides, niobium pentoxide, bismuth sesquioxide, antimony sesquioxide, chromium oxides such as chromium sesquioxide and chromium trioxide, molybdenum trioxide, tungsten trioxide, selenium dioxide, tellurium dioxide, manganese dioxide, iron sesquioxide, trinickel tetroxide, nickel oxide, cobalt dioxide, and cobalt oxide; the chalcogens are, for example, titanium sulfide, zirconium sulfide, hafnium sulfide, tantalum sulfide, molybdenum sulfide, tungsten sulfide, titanium selenide, zirconium selenide, hafnium selenide, vanadium selenide, niobium selenide, tantalum selenide, molybdenum selenide, and tangsten selenide.

Thus, the invention described herein makes possible the objects of (1) providing an electrode that is prepared by deposition of carbon particles onto a substrate from the gas phase by low-temperature thermal decomposition; (2) providing an electrode that is strong in its charge and discharge cycle and resistant to being overcharged; (3) providing an electrode that has a high filling density, since no further additional conductive materials are required, which gives high density characteristics of the electrode; (4) providing an electrode that is useful in secondary batteries since its manufacturing processes are simplified; (5) providing a miniature battery by the use of the above-mentioned electrode, which is excellent in its charge and discharge cycle characteristics, produced at low cost, and widely useful in a variety of fields; and (6) providing a secondary battery with a nonaqueous electrolytic solution, which comprises a negative electrode, a positive electrode, and a nonaqueous electrolytic solution, wherein the capacity for charging and discharging of the said positive electrode is greater than that of the said negative electrode so that the charge and discharge cycle characteristics of this battery can be improved, thereby increasing its industrial usefulness greatly.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Example 1

Figure 1:
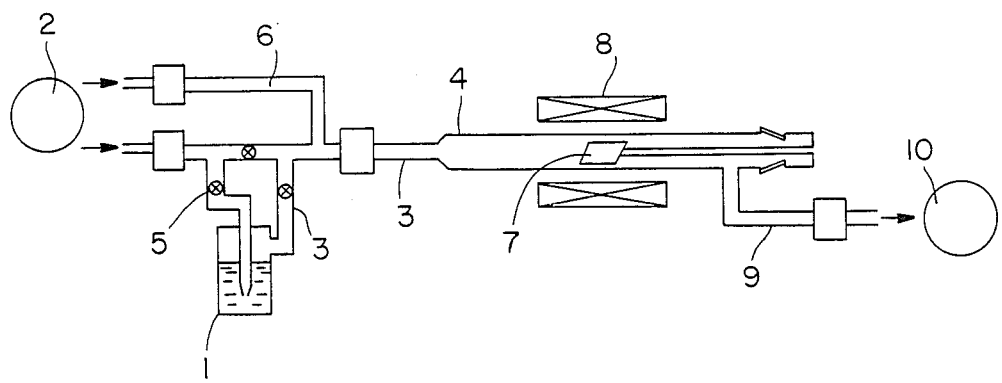
FIG. 1 is a block diagram showing an apparatus for the production of carbon materials used for this invention.

FIG. 1 is a block diagram showing the apparatus for the production of the carbon materials of this invention. As the hydrocarbon that is used as the starting material and as the hydrocarbon compound one part of which incorporates a variety of specific groups, aliphatic hydrocarbons (preferably, unsaturated hydrocarbons), aromatic compounds, and alicyclic compounds are used. These are heat-decomposed at 1000° C. The above-mentioned hydrocarbons and hydrocarbon compounds are, for example, acetylene, diphenylacetylene, acrylonitrile, 1,2-dibromoethylene, 2-butyne, benzene, toluene, pyridine, aniline, phenol, diphenylanthracene, pyrene, hexamethylbenzene, styrene, allylbenzene, cyclohexane, n-hexane, pyrrole, and thiophene.

Depending on the variety of hydrocarbon compound that is used, the amount of hydrocarbon compound to be supplied to the reaction tube mentioned below is controlled at a level of below several millimoles per one hour by the bubbling method, evaporation, or sublimation. If the amount supplied is large, carbon accumulates in the form of soot, which causes difficulties in attaining the objects of this invention. It is necessary that the substrate on which the carbon materials are deposited does not deteriorate when treated at the reaction temperature of 1000° C.

Below, the steps in manufacturing are explained.

To a container 1, which contains benzene that has been carefully refined by vacuum distillation, argon gas is supplied from an argon gas control system 2 so as to bubble the benzene. Then, benzene molecules are supplied to a quartz reaction tube 4 through a Pyrex glass tube 3. At this time, the liquid benzene in the container 1 is maintained at a fixed temperature, and the rate of flow of the argon gas is controlled by valves 5 so that the amount of benzene molecules to be supplied into the reaction tube 4 is controlled at a few millimoles per hour. On the other hand, argon gas flows through a dilution line 6, and immediately before being supplied to the reaction tube 4, the density of the benzene molecules in the argon gas and the rate of flow are made optimum. In reaction tube 4, there is provided a sample stand 7 on which a substrate is placed. There is a furnace 8 surrounding the outside of reaction tube 4. This furnace 8 keeps the substrate in reaction tube 4 at about 1000° C. When benzene molecules are supplied to the inside of the reaction tube 4, these benzene molecules are heat-decomposed within the reaction tube 4, and they form an accumulation of carbon on the substrate. The gas in reaction tube 4 is taken via a gas-ejection pipe 9 into a gas ejection system 10, and thus the gas is removed from the reaction tube 4. The benzene molecules introduced into the reaction tube 4 are heat-decomposed at a temperature of about 1000° C., and then are grown on the substrate.

Figure 2:
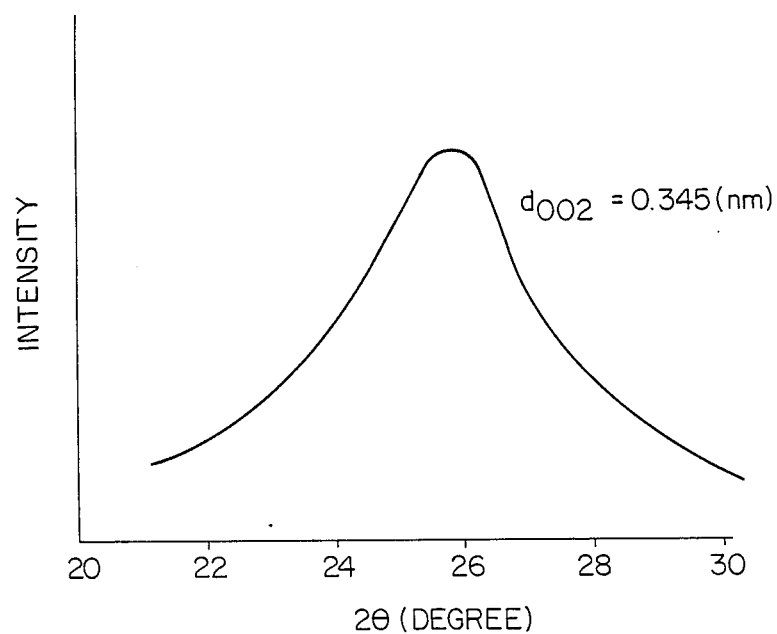
FIG. 2 is an X-ray diffraction profile with the $CuK_\alpha$ rays of the carbon materials of Example 1 of this invention.

In this case, the carbon that is grown forms a thin film with a metallic luster, and compared to the graphite material that is formed when conventional methods are used, the carbon material has properties that are more suitable for the purposes of this invention, because the reaction proceeds at relatively low temperatures. Moreover, the starting materials used, the amount of starting materials to be supplied, the rate of supply, and the reaction temperature are selected so that it is possible to control anisotrophy and the like. FIG. 2 shows the X-ray diffraction profile of this carbon material with the CuK$_\alpha$ rays.

Based on (002) reflection peak, the mean planar spacing obtained by the Bragg equation is 3.45 Å.

$$d = \frac{\lambda}{2 \sin \theta} \text{ (wherein } \lambda = 1.5418 \text{ Å)}$$

Based on the full-width of half of the maximum of the peak, $\beta$, the size of the unit crystal in the c-axis direction obtained by the following equation (1) is 27.2 Å.

$$Lc = \frac{K \cdot \lambda}{\beta \cos \theta} \quad (1)$$

(wherein $\lambda = 1.5418$ Å and $K = 0.9$)

Figure 3:
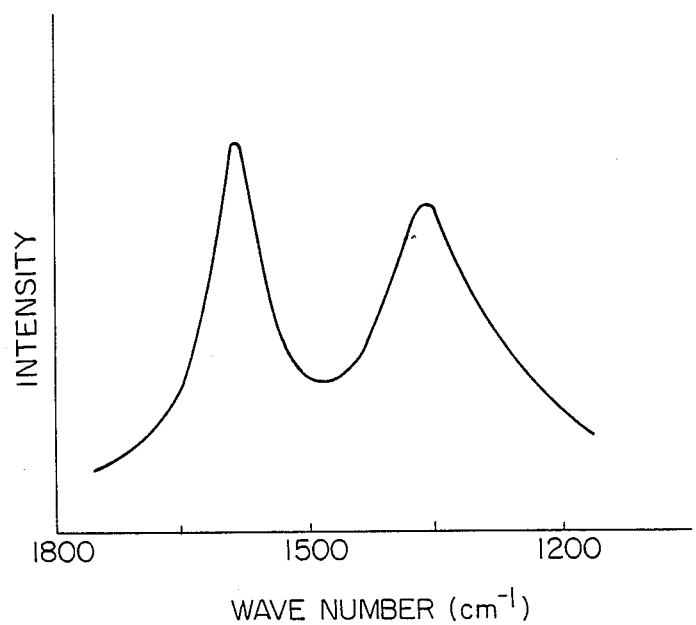
FIG. 3 is a characteristic profile showing the Raman spectrum of the carbon materials of Example 1 of this invention.

FIG. 3 is a Raman spectrum of this carbon material with the use of an argon laser. This figure indicates that the ratio of the peak strength at 1360 cm$^{-1}$ to the peak strength at 1580 cm$^{-1}$ is 0.8. A diffraction pattern of an electron beam obtained by the method of reflective high-energy electron diffraction (RHEED) showed that the reflections at the (002) plane, the (004) plane, and the (006) plane are broad spots, so the orientation of each unit crystal is relatively good, and moreover the distribution in the c-axis orientation is within ±18°.

Figure 4:
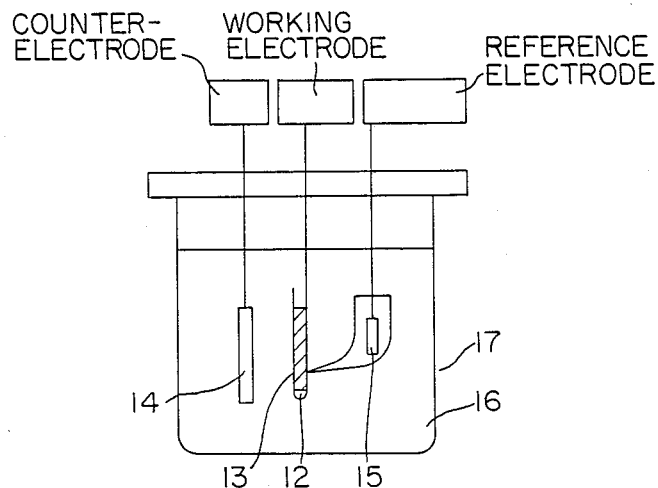
FIG. 4 is a diagram showing an apparatus for the measurement of the electrode characteristics of the carbon materials of this invention.
Figure 5:
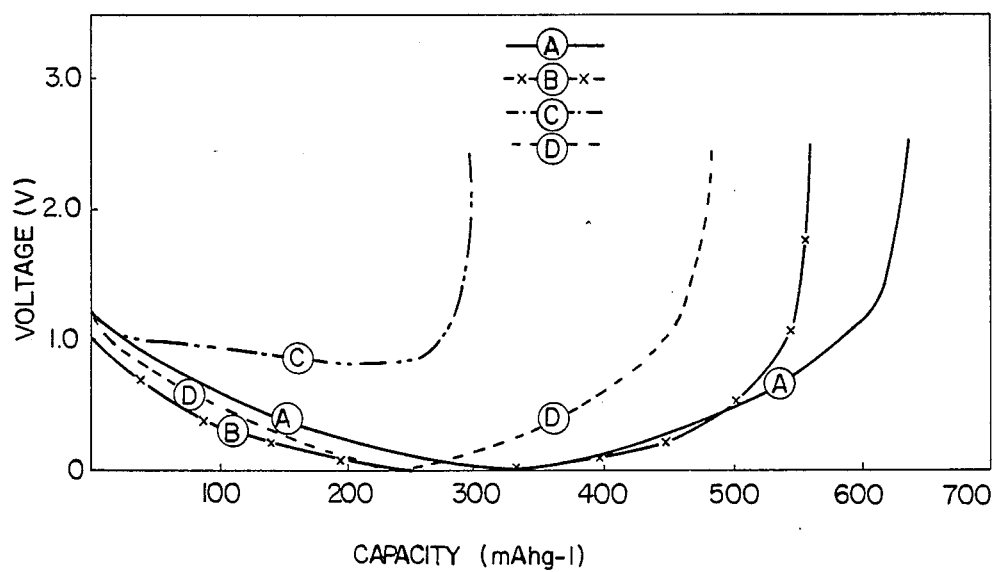
FIG. 5 is of the characteristic curves for charging and discharging of the carbon materials of the Examples 1 and 2 of this invention and of existing carbon materials of Controls 1 and 2.
Figure 6:
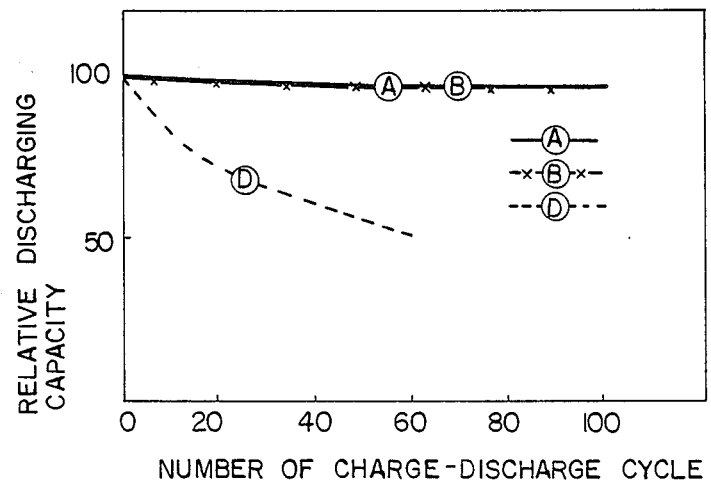
FIG. 6 is the cycle characteristic curves showing the capacities for discharging of the carbon materials of Examples 1 and 2 of this invention and of existing carbon materials of Controls 1 and 2.

The thin carbon film produced as mentioned above is sandwiched by current collecting nets, resulting in a test sample electrode A. The test sample electrode A is, as shown in FIG. 4, placed inside of an electrolytic bath, which is provided with lithium metal as the counter-electrode, and a charging and discharging test, in which atoms of lithium as the dopant are incorporated into and removed from the sample electrode A, is carried out. In FIG. 4, the reference numeral 12 is the test sample electrode A made from the carbon of this example, 13 is the current collector, 14 is the counter-electrode, and 15 is the reference electrode, which is of lithium, 16 is an electrolytic solution of propylene carbonate containing lithium perchlorate in the concentration of 1M, and 17 is the electrolytic bath. FIG. 5 is of curves showing changes in the electric potential of the test sample electrode A based on that of the lithium reference electrode at 25° C. when a variety of carbon materials are doped or dedoped with lithium. The curve A in FIG. 5 is the curve of changes in the electric potential when the carbon material of this example is used. In Curve A, the area in which the potential approaches 0 volts indicates doping (i.e., charging), and the area in which the potential approaches high voltages indicates dedoping (i.e., discharging). FIG. 6 shows changes in the charging and discharging capacity of sample electrodes made of a variety of carbon materials in a charging and discharging test in which the sample electrodes are charged and discharged with a fixed current flow in the range of 0 to 2.5 volts, with respect to the lithium reference electrode. The Curve A in FIG. 6 is the characteristic curve for this example, which clearly indicates that there is almost no deterioration in the capacity even with repeated charging and discharging, and thus the characteristics on repeated charging and discharging of the electrodes are extremely satisfactory.

It is therefore possible to construct a negative electrode for a secondary battery of nonaqueous lithium that can be charged and discharged by use of electrode materials such as those mentioned above.

Example 2

Figure 7:
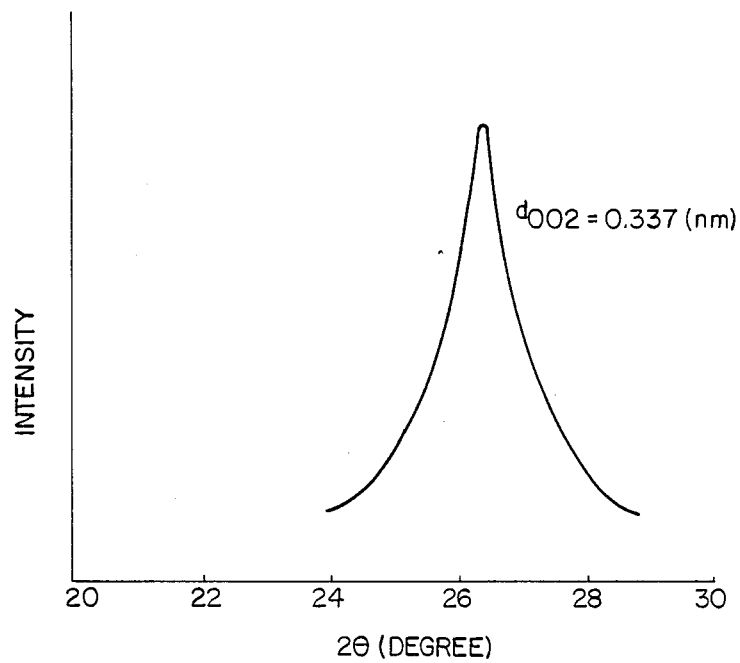
FIG. 7 is an X-ray diffraction profile with the $CuK_\alpha$ rays of the carbon materials of Example 2 of this invention.
Figure 8:
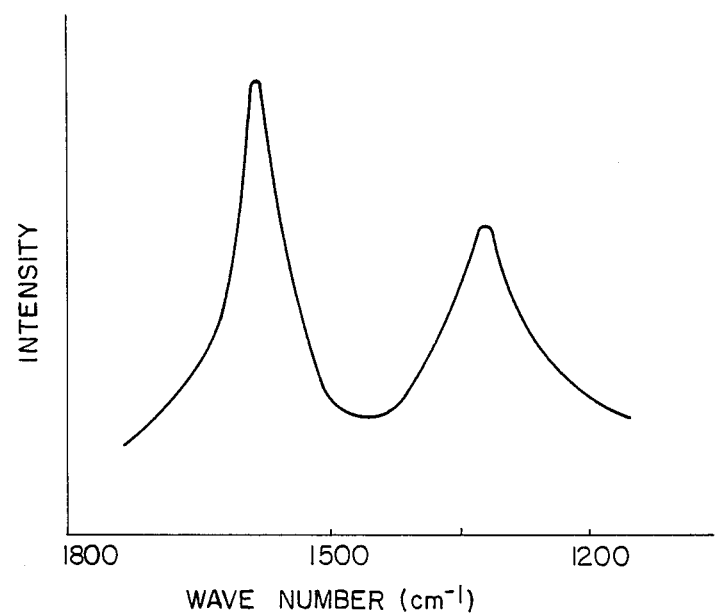
FIG. 8 is a characteristic profile showing the Raman spectrum of the carbon materials of Example 2 of this invention.

By the same production method as in Example 1, carbon particles were deposited on a nickel substrate. The various characteristics of the said carbon particles were investigated by use of the same techniques as in Example 1, and it was found that the mean planar spacing is 3.37 Å, as shown in FIG. 7, and that the ratio of the peak strength at 1360 cm$^{-1}$ to that at 1580 cm$^{-1}$ was 0.50, as shown in FIG. 8. Moreover, the distribution in the c-axis direction of each unit crystal obtained by reflective high-energy electron diffraction was within ±60°.

A lead wire was connected to the above-mentioned carbon deposited to the substrate, resulting in a test sample electrode B, which was then tested in a charging and discharging test in the same manner as in Example 1, in which the electrode B was doped and dedoped with lithium as a dopant. The Curve B in FIG. 5 is the curve of changes in the electric potential in the carbon material of this example. The Curve B in FIG. 6 also shows the changes in the discharging capacity in a test of repeated charging and discharging of the carbon material of this invention. As these results show clearly, the discharging capacity and the characteristics on repeated charging and discharging were extremely satisfactory. Carbon particles obtained by use of the manufacturing methods shown in this example had a mean layer interval of 3.37 Å to 3.55 Å, and the ratio of the peak strength at 1360 cm$^{-1}$ to that at 1580 cm$^{-1}$ on Raman laser spectrum was between 0.4 and 1.0. In addition, the relative slope in the c-axis direction of each unit crystal obtained by reflective high-energy electron diffraction was below ±75°, and often below ±60°.

Carbon particles that meet these values for physical properties can be obtained only by methods such as those described in these examples, and the soot-like carbon deposit obtained at lower temperatures and/or the highly oriented graphite carbon obtained at higher temperatures will not give the electrode characteristics described above. However, the purposes of this invention can be achieved by optimization by the photochemical vapor deposition method and the plasma chemical vapor deposition method, which do not use heat energy.

In these examples, 1-M lithium perchlorate was used as an electrolyte and propylene carbonate was used as a solvent for the electrolyte. However, not only the electrolyte specified in these examples, but also other electrolytes can be used alone or in a mixture, such as lithium perchlorate, lithium hexafluoroarsenate, lithium borofluoride, lithium trifluoromethanesulfonate, etc. As a solvent for dissolving therein of the electrolyte, dimethylsulfoxide, γ-butyrolactone, sulfolane, tetrahydrofuran, 2-methyltetrahydrofuran, 1,2-dimethoxyethane, 1,3-dioxolane, and other organic solvents, can be used as a single solvent or as a mixed solvent.

Control 1

Figure 9:
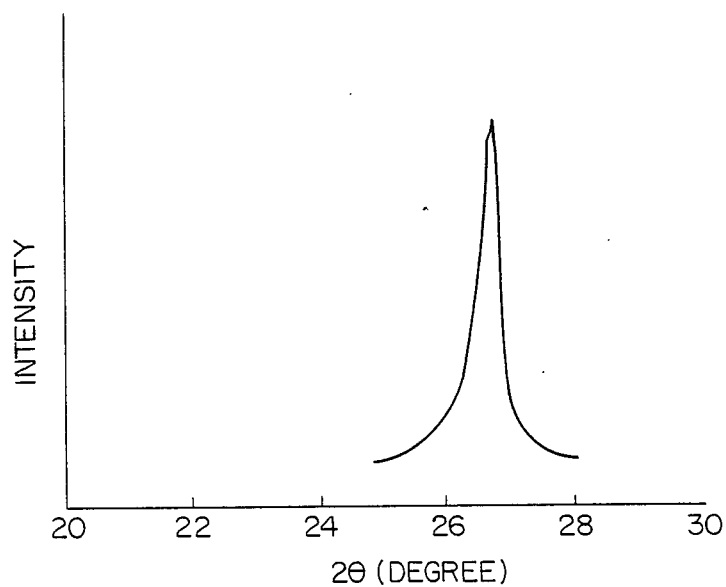
FIGS. 9 and 11 are X-ray diffraction profiles with the $CuK_\alpha$ rays of existing carbon materials of Controls 1 and 2.
Figure 10:
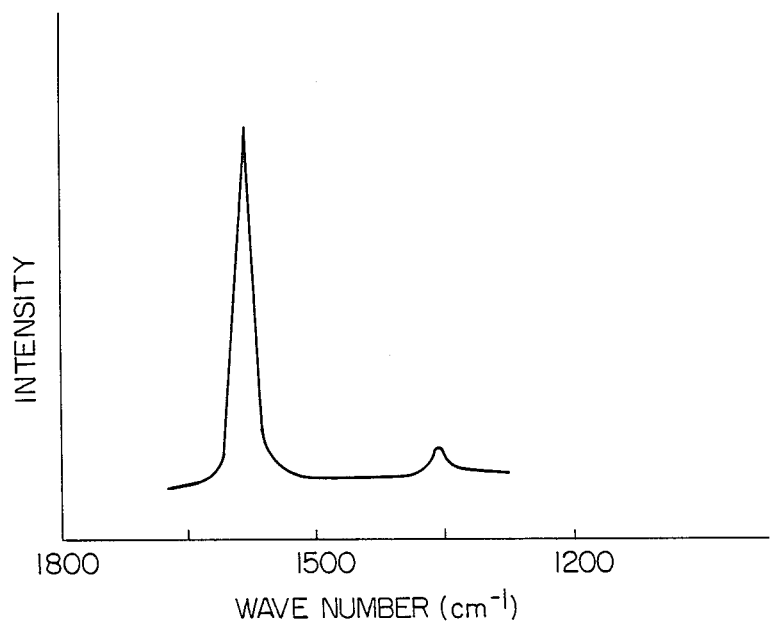
FIGS. 10 and 12 are characteristic profiles showing the Raman spectra of the existing carbon material of Controls 1 and 2.

By the use of the same methods as in Example 1, carbon particles were deposited on a quartz substrate at 1200° C. This deposit was torn off from the substrate and heat-treated at 2800° C., which gave highly oriented graphite-like carbon particles. The X-ray diffraction data from the said carbon particles are shown in FIG. 9. The planar spacing of the carbon particles was 3.36 Å. The ratio of the peak strength at 1360 cm$^{-1}$ to that at 1580 cm$^{-1}$ on Raman spectrum was 0.1. The said carbon particles were used in a test sample electrode C by the same methods as in Example 1. As shown in FIG. 4, the test sample electrode C was put into an electrolytic bath and a charging and discharging test was done as for Example 1. The Curve C in FIG. 5 is the curve showing the changes in the electric potential of this control carbon material. These results show that the discharging capacity of this material was significantly smaller than that of the materials of Examples 1 and 2, and that the material was not suited for use as an electrode.

Control 2

Figure 11:
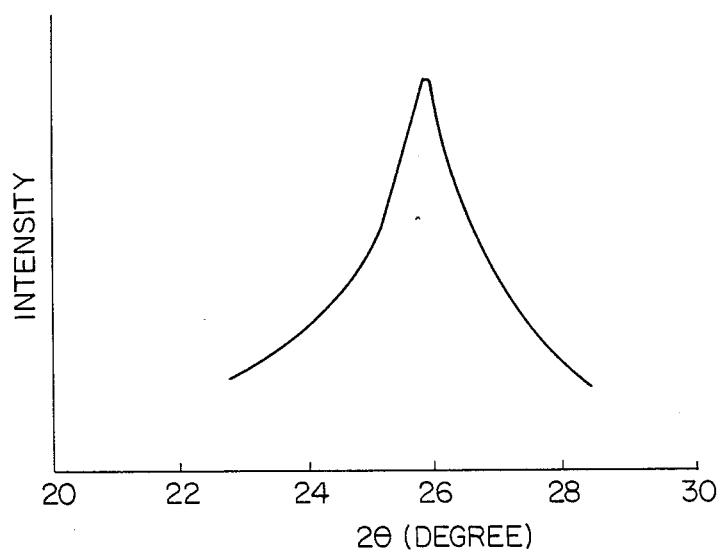
Figure 12:
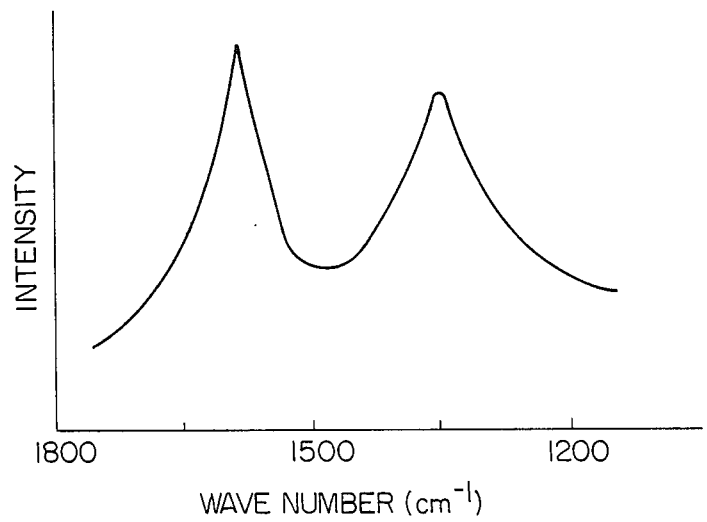

Petroleum coke that had been semirefined by removal of the volatile fractions from crude oil was heat-treated at 500° C. The X-ray diffraction of this carbon powder is shown in FIG. 11. The mean layer spacing based on (002) reflection shown by this diffraction peak was 3.45 Å. The ratio of the peak strength at 1360 cm$^{-1}$ to that at 1580 cm$^{-1}$ on Raman spectrum was 0.8. These results are shown in FIG. 12. The diffraction pattern by reflective high-energy electron diffraction of an electrode obtained by the pressing of this carbon powder showed uniform rings, which means that there was no orientation. A nickel-foam substrate was charged with the said carbon powder and pressed, resulting in a test sample electrode D. The test sample electrode D was put into an electrolytic bath as shown in FIG. 4, and a charging and discharging test was done by the same method as that in Example 1. The Curve D of FIG. 5 is the curve showing changes in the electric potential in this control carbon material. These results show that the discharging capacity of this material is smaller than that of the materials of Examples 1 and 2. However, the characteristics in the initial stage of discharging are better than those in Control 1. By the same methods as in Example 1, the test sample electrode D was tested in a charging and discharging test. The Curve D in FIG. 6 shows the results obtained with this control. The results show that the capacity of the electrode in which there is absolutely no orientation in the unit crystals deteriorates as charging and discharging are repeated, so that the electrode cannot be used for long periods of time.

Example 3

Figure 13:
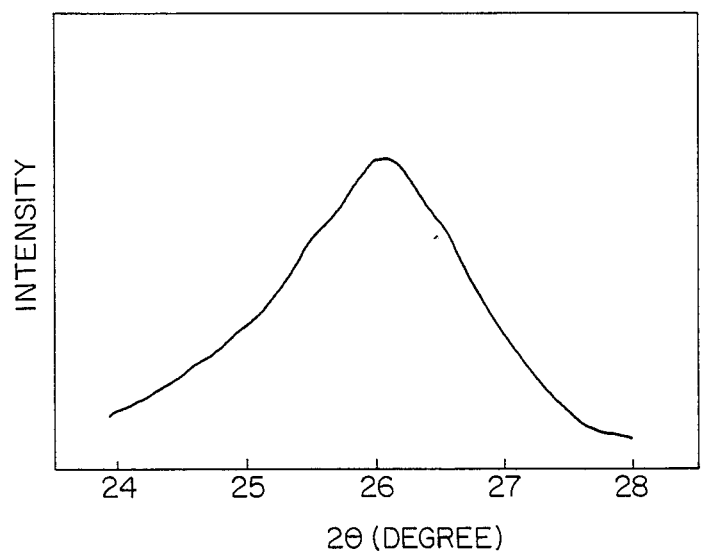
FIG. 13 is an X-ray diffraction profile with the $CuK_\alpha$ rays of carbon particles used in the electrode E of Example 3 of this invention.

On the sample holder 7 shown in FIG. 1, a three-dimensional structured conductive substance made of a nickel foam with a diameter of 15 mm and a thickness of 1.0 mm was placed. On this substance, carbon particles were deposited by the same method as in Example 1. The mean layer spacing of the carbon particles was 3.42 Å, and the ratio of the peak strength at 1360 cm$^{-1}$ to that at 1580 cm$^{-1}$ on Raman spectrum was 0.75. The size of each unit crystal in the c-axis direction obtained from the X-ray diffraction peak shown in FIG. 13 was calculated to be 48.6 Å by equation 1.

The diffraction pattern obtained by reflective high-energy electron diffraction of the carbon particles deposited on a conductive substrate, which was placed on the same sample stand as the above-mentioned three-dimensional structured d on a conductive substrate, which was placed on the same sample stand as the above-mentioned three-dimensional structured substance, had broad arc-shaped rings. The slope of each unit crystal in the c-axis direction found from this diffraction pattern was within ±35°, which means that the orientation of the carbon particles was high. The CuK$_\alpha$ X-ray diffraction pattern and the Raman spectrum of naturally occurring graphite from Madagascar were investigated in the same manner as for the said carbon particles, and it was found that the mean layer interval was 3.36 Å and that the ratio of the peak strength at 1360 cm$^{-1}$ to that at 1580 cm$^{-1}$ on the Raman spectrum was 0.1.

As mentioned above, even though there is not a large difference in the mean layer interval between the carbon particles of this example and naturally occurring graphite, there is a large difference in the Raman band at 1360 cm$^{-1}$ therebetween that reflects disorder in the crystal structure of the graphite. Therefore, it can be seen that the carbon particles of this example have a layer structure more disordered than graphite such as that that occurs naturally.

An electrode that is composed of carbon particles, which are deposited on the conductive substrate mentioned above by thermal decomposition at low temperatures from the vapor phase, and the three-dimensional structured substrate was pressed by a press, resulting in a test sample electrode E. This electrode E was tested in a charging and discharging test by the three-electrode method in which lithium was used as a reference electrode and a counter-electrode. The electrolyte was 1-M lithium perchlorate in propylene carbonate solution. To evaluate the characteristics of the electrode E obtained above, a control electrode F was manufactured as follows: The reaction apparatus of FIG. 1 was used for the thermal decomposition of benzene, which was allowed to deposit on a quartz substrate and was then made into a powder. To the powdered carbon, 20 parts by weight of powdered polyethylene per 100 parts by weight of powdered carbon were added and mixed thoroughly. Then a three-dimensional structured substance made of a nickel foam with a diameter of 15 mm and a thickness of 1.0 mm was charged with the above mixture and maintained at 150° C., followed by pressing under 300 kg cm$^{-2}$, resulting in an electrode F. This electrode F was also tested in a charging and discharging test in the same manner as for the electrode E.

Figure 14:
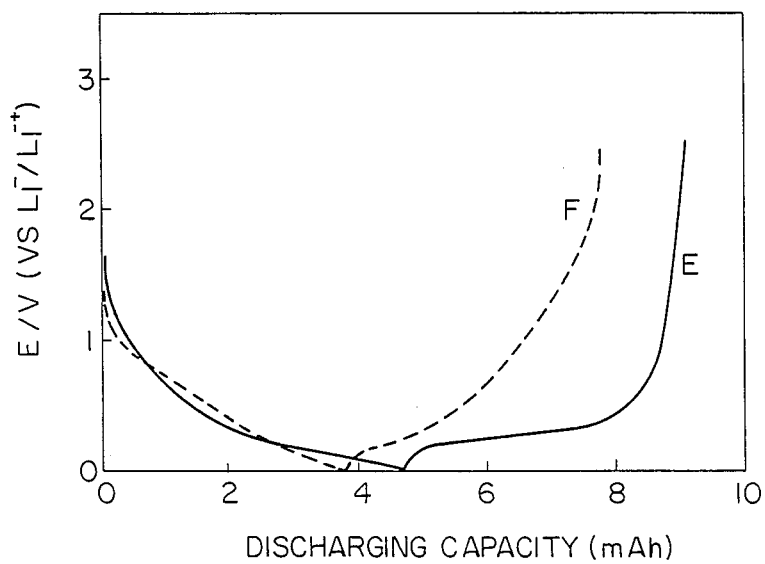
FIG. 14 is of characteristic curves of charging and discharging of the electrode E of Example 3 and of the reference electrode F.

FIG. 14 shows the charging and discharging characteristics of the electrode E of this example (shown as the solid curve E) and also the charging and discharging characteristics of the control electrode F (shown as the dotted curve F). The results show that when these electrodes made in the same shape are compared, the test electrode E of this example has a larger electric capacity than the control electrode F. Thus, the accumulation of an active electrode material (i.e., carbon particles) onto a conductive substrate gives a high-capacity electrode, the manufacturing steps of which have been simplified.

An electrode manufactured by the above process is used as a negative or a positive electrode, and the counter-electrode is made of an electrode substance, examples of which are positive or negative ion-doped conductive substance (e.g., a polymer such as polyacetylene doped with Li$^+$, K$^+$, ClO$_4^-$, BR$_4^-$, etc.), a substance made from nickel chloride, and metal oxides (e.g., zinc, MnO$_2$, Bi$_2$O$_3$, Cr$_3$O$_8$, etc.) or other kinds of electrode substances. As the electrolyte, solid electrolyte substances such as lithium nitride, betaalumina, and nonaqueous organic electrolytes can be used, resulting in a chargeable and dischargeable secondary battery. Moreover, the electrodes both can be made from the carbon material manufactured by the above-mentioned process.

The battery of this example is provided with the electrode with excellent charging and discharging characteristics shown in FIG. 14, so it is very reliable for repeated use over a long lifetime.

Example 4

A secondary battery with a nonaqueous electrolytic solution is described below: Benzene was used as the starting material for the active material of the negative electrode, and carbon particles were produced therefrom by low-temperature thermal decomposition. Different kinds of oxides and chalcogen compounds were used as the active material for the positive electrode. As the electrolyte, 1-M lithium perchlorate in propylene carbonate was used. The carbon for use as the active material of the negative electrode was made by the same method as that in Example 3.

Chromium trichloride was heat-treated at 230° C. in a pressure-resistant vessel, resulting in an oxide with a composition of $Cr_3O_8$. To 100 parts by weight of the oxide, 20 parts by weight of powdered polyethylene and 10 parts by weight of acetylene black were added, and the mixture was formed into a positive electrode by the application of 300 kg cm$^{-2}$ of pressure at a temperature of 120° C.

Figure 15:
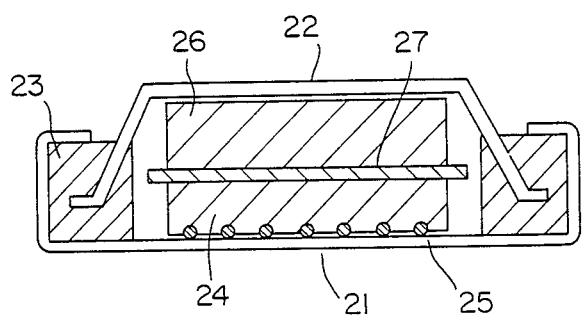
FIG. 15 is a cross-sectional view showing a secondary battery of this invention.

These positive and negative electrodes and a separator made from unwoven cloth of polyethylene were dried in a vacuum for 8 hours at 120° C. to remove water therefrom. When propylene carbonate containing 1-M lithium perchlorate was used as the electrolytic solution, the capacities of the positive and negative electrodes were 18 mAh and 7.0 mAh, respectively. FIG. 15 is a cross-sectional view of the battery constructed with the positive electrode, the negative electrode, and the separator mentioned above, wherein reference numerals 21 and 22 are the stainless-steel cans for the positive and negative electrodes, respectively, which were separated by the insulating packing 23 made of polypropylene. Reference numeral 24 is the positive electrode made of the active material $Cr_3O_8$. This positive electrode 24 was pressed against the positive current-collector 25 fixed to the inner bottom of the can 21 for the positive electrode. Reference numeral 26 is the negative electrode made of an active material, carbon substance, which was welded in placed to the can 22 for the negative electrode. Reference numeral 27 is the separator. Propylene carbonate containing 1-M lithium perchlorate was used as the electrolytic solution, with which the space formed by the cans 21 and 22 and the packing 23 was filled, resulting in a battery G.

Other batteries H to K were manufactured in the same manner as was battery G. As shown in Table 1, different kinds of oxides and chalcogen compounds were used for the positive electrodes of the batteries H to K and the carbon substance of this example was used for the negative electrode.

TABLE 1

| Battery | Negative electrode (Carbon) Capacity, mAh | Positive electrode | Capacity, mAh |
|---|---|---|---|
| G | 7.0 | $Cr_3O_8$ | 18 |
| H | 7.0 | $V_2O_5$ | 13 |
| I | 7.0 | $MoO_3$ | 16 |
| J | 7.0 | $MnO_2$ | 13 |

TABLE 1-continued

| Battery | Negative electrode (Carbon) Capacity, mAh | Positive electrode | Capacity, mAh |
|---|---|---|---|
| K | 7.0 | $TiS_2$ | 17 |

Figure 16:
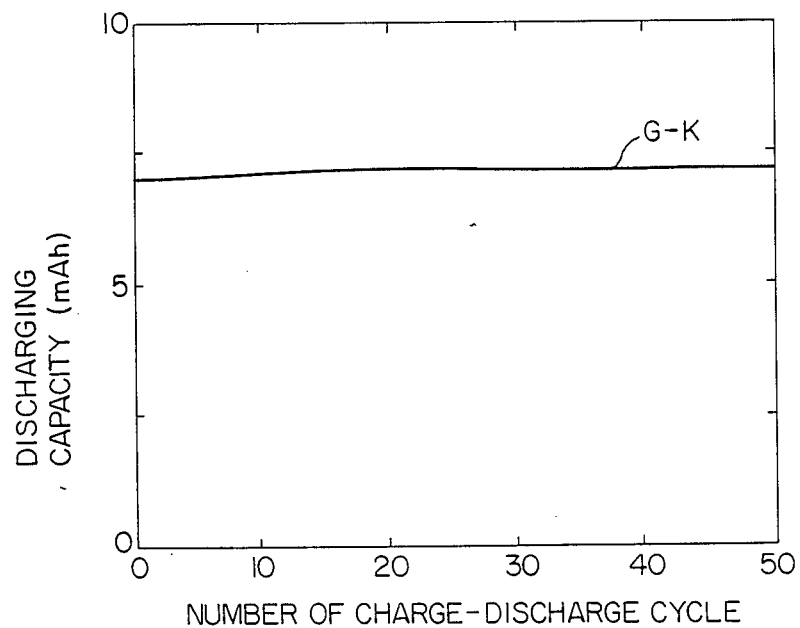
FIG. 16 is a characteristic curve showing the relationships between the number of charge cycles and the charging and discharging capacity of the batteries G–K of Example 4 of this invention.

FIG. 16 shows the characteristics of the charge and discharge cycle of these batteries. The charging and discharging test was carried out under the charging and discharging conditions where the charging current density was 1 mA cm$^{-2}$ for 4 hours, the discharging current density was 1 mA cm$^{-2}$, and the final discharge voltage was 2.0 V.

Control 3

Control batteries G' to K' shown in Table 2 were manufactured in the same manner as the batteries G to K of Example 4, except that a rolled lithium plate in a round shape with a diameter of 15 mm was used as the negative electrode, which was pressed against the negative current collector fixed to the inner bottom of the can 22 for the negative electrode.

TABLE 2

| Battery | Negative electrode (Li) Capacity, mAh | Positive electrode | Capacity mAh |
|---|---|---|---|
| G' | 30 | $Cr_3O_8$ | 7.0 |
| H' | 30 | $V_2O_5$ | 7.0 |
| I' | 30 | $MoO_3$ | 7.0 |
| J' | 30 | $MnO_2$ | 7.0 |
| K' | 30 | $TiS_2$ | 7.0 |

Figure 17:
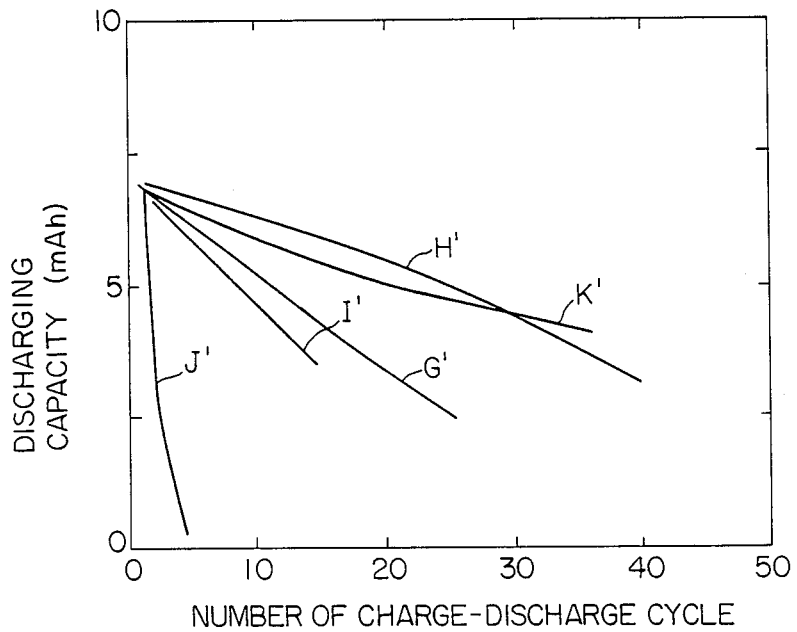
FIG. 17 is of characteristic curves showing the relationships between the number of cycles and the charging and discharging capacity of the batteries G'–K' of Control 3.

FIG. 17 shows the characteristics of the charge and discharge cycle of these control batteries. The charging and discharging test was carried out under the charging conditions where the charging current density was 1 mA cm$^{-2}$ for 4 hours, the discharging current density was 1 mA cm$^{-2}$, and the final discharge voltage was 2.0 V.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An electrode comprising as the main component carbon materials that have a layer structure more disordered than graphite and have hexagonal net faces with a selective orientation, the mean spacing of said hexagonal net faces ranging from 3.37 Å to 3.55 Å, wherein said carbon materials further have the ratio of the peak strength at 1,360 cm$^{-1}$ to the peak strength at 1,580 cm$^{-1}$ of the argon laser Raman spectrum ranging from 0.4 to 1.0.

2. An electrode according to claim 1, wherein said carbon materials are carbon deposits that are obtained by thermal decomposition of the gas phase of a hydrocarbon or a hydrocarbon compound, which is prepared by the addition of a specific group including at least one selected from oxygen, nitrogen, sulfur, and a halogen to a part of said hydrocarbon or by the substitution of said specific group for a part of said hydrocarbon.

3. An electrode according to claim 1, wherein said carbon materials are doped with alkali metals, alkaline earth metals, rare earth metals, or transition metals.

4. An electrode according to claim 1, wherein said carbon metals are doped with halogens, halogen compounds, or oxygen acids.

5. An electrode according to claim 1, wherein said carbon materials are deposited on a conductive substrate.

6. An electrode according to claim 5, wherein said conductive substrate is a porous substrate with a porosity of 60% or more.

7. A battery comprising an electron-donating substance and an electron-attracting substance as the charge carrier, wherein the substrate of said charge carrier is the electrode according to claim 5.

8. A battery according to claim 7, wherein said electron-donating substance is an alkali metal, an alkaline earth metal, a rare earth metal, or a transition metal.

9. A battery according to claim 7, wherein said electron-attracting substance is a halogen or a halogen compound.

10. A battery according to claim 7, wherein the conductive substrate of said electrode is a flat board, a metal foam, a nonwoven metal cloth, or a woven metal cloth.

11. A secondary battery with a nonaqueous electrolytic solution comprising a positive electrode, a nonaqueous electrolytic solution, and a negative electrode that has carbon materials according to claim 1 as the active substances that can form an electrochemically reversible compound with a light-weight metal element, wherein said positive electrode is made such that its capacity for being charged or discharged is greater than that of said negative electrode.

* * * * *